US007840177B2

(12) United States Patent
DeBusk et al.

(10) Patent No.: US 7,840,177 B2
(45) Date of Patent: Nov. 23, 2010

(54) DEVICE FOR MONITORING MULTIPLE BROADCAST SIGNALS

(75) Inventors: David L. DeBusk, Nashville, TN (US); Darren P. Briggs, Nashville, TN (US); Richard Wardwell, Nashville, TN (US); David A. Gilbert, Nashville, TN (US); Jack E. Jenkins, Antioch, TN (US); Paul P. Griffin, Jr., Nashville, TN (US); Fredric I. Graham, Nashville, TN (US); George Anderson Cook, Nashville, TN (US); Dustin Withers, Hermitage, TN (US)

(73) Assignee: Landmark Digital Services, LLC, Nashville, TN (US)

( * ) Notice: Subject to any disclaimer, the term of this patent is extended or adjusted under 35 U.S.C. 154(b) by 656 days.

(21) Appl. No.: 11/752,629

(22) Filed: May 23, 2007

(65) Prior Publication Data

US 2008/0290970 A1 Nov. 27, 2008

(51) Int. Cl.
*H04H 1/00* (2006.01)
(52) U.S. Cl. .............. 455/3.01; 455/67.11; 455/151.1; 455/140
(58) Field of Classification Search .......... 455/3.01, 455/67.11, 3.02, 67.15, 140, 142, 150.1, 455/151.2, 154.1, 17, 515; 370/466, 328, 370/401; 725/131, 80, 74, 106
See application file for complete search history.

(56) References Cited

U.S. PATENT DOCUMENTS 3,919,479 A 11/1975 Moon et al.
4,415,767 A 11/1983 Gill et al.
4,450,531 A 5/1984 Kenyon et al.
4,843,562 A 6/1989 Kenyon et al.
4,852,181 A 7/1989 Morito et al.
5,210,820 A 5/1993 Kenyon (Continued)

FOREIGN PATENT DOCUMENTS

WO   WO 01/88900 A2   11/2001

(Continued)

OTHER PUBLICATIONS

International Search Report and Written Opinion issued for PCT/US2008/064258; Dated: Jul. 15, 2008; 11 Pages.

(Continued)

*Primary Examiner*—John J Lee
(74) *Attorney, Agent, or Firm*—Woodcock Washburn LLP (57) ABSTRACT

A media content monitoring system uses a rack adapted to receive multiple carrier boards to improve the system's ability to be configured to specific applications. Each carrier board contains tuner modules for receiving AM/FM broadcasts, satellite radio broadcasts, TV audio broadcasts, HD, IBOC, DAB and DRM digital radio broadcasts, etc. The tuner modules produce a USB output that is combined by a USB hub on the carrier boards into a single USB output. The carrier board outputs are in turn combined by a rack based USB hub into single USB output that is provided to a host computer. The host computer includes content identification software that automatically identifies selected media content received by the tuner modules and stores the selected content in a database. The host computer can send control codes to the tuner modules to alter their reception parameters.

15 Claims, 8 Drawing Sheets

U.S. PATENT DOCUMENTS

| | | | |
|---|---|---|---|
| 5,276,629 | A | 1/1994 | Reynolds |
| 5,400,261 | A | 3/1995 | Reynolds |
| 5,437,050 | A | 7/1995 | Lamb et al. |
| 5,606,143 | A | 2/1997 | Young |
| 5,918,223 | A | 6/1999 | Blum et al. |
| 6,021,491 | A | 2/2000 | Renaud |
| 6,121,530 | A | 9/2000 | Sonoda |
| 6,434,520 | B1 | 8/2002 | Kanevsky et al. |
| 6,453,252 | B1 | 9/2002 | Laroche |
| 6,480,825 | B1 | 11/2002 | Sharma et al. |
| 6,483,927 | B2 | 11/2002 | Brunk et al. |
| 6,570,080 | B1 | 5/2003 | Hasegawa et al. |
| 6,574,594 | B2 | 6/2003 | Pitman et al. |
| 6,748,360 | B2 | 6/2004 | Pitman et al. |
| 6,834,308 | B1 | 12/2004 | Ikezoye et al. |
| 6,941,275 | B1 | 9/2005 | Swierczek |
| 6,990,453 | B2 | 1/2006 | Wang et al. |
| 7,055,166 | B1 | 5/2006 | Logan et al. |
| 7,174,293 | B2 | 2/2007 | Kenyon et al. |
| 7,194,752 | B1 | 3/2007 | Kenyon et al. |
| 2002/0050876 | A1* | 5/2002 | Kawai ............................ 334/1 |
| 2002/0099555 | A1 | 7/2002 | Pitman et al. |
| 2002/0100051 | A1* | 7/2002 | Applewhite et al. ........... 725/80 |
| 2004/0064319 | A1 | 4/2004 | Neuhauser et al. |
| 2005/0063418 | A1* | 3/2005 | Case .......................... 370/466 |
| 2006/0268763 | A1* | 11/2006 | George ....................... 370/328 |

FOREIGN PATENT DOCUMENTS

| | | |
|---|---|---|
| WO | WO 01/88900 A3 | 11/2001 |
| WO | WO 02/11123 | 2/2002 |

OTHER PUBLICATIONS

Chinese Office Action issued for 03808938.6 dated May 26, 2006.

Kashino et al. "A quick Search Method for Audio and video Signals bAsed on Histogram Pruning," Sep. 2003, Publihsed in IEEE vol. 5, No. 3, pp. 348-357.

C. Yang, "Music Database Retrieval Based on Spectral Similarity," Stanford University Database group tEchnical Report 2001-14, http://citeseer.ist.psu.edu/yang01music.html., submitted Mar. 28, 2001, 9 pages, [Retrieved from the internet on Jun. 6, 2005] [Retrieved from URL://http://cieseer.ist.psu.edu/yang01music.html].

Erling Wold et al., "Content-Based Classification, Search, and Retrieval of Audio," in IEEE Multimedia, vol. 3 No. 3: Fall 1996, pp. 27-36.

Matthew L. Miller et al., "Audio Fingerprinting: Nearest Neighbor Search in High Dimensional Binary Spaces," IEEE Multimedia Signal Processing Workshop 2002, St. Thomas, US Virgin Islands.

Sharlene A. Liu, "Landmark Detection for Distinctive Feature-Based speech Recognition," J. Acoust. Soc. Am 100 (5), Nov. 1996, pp. 3417-3430.

Udi Manber, "Finding Similar Files in a Large File System," Oct. 1993, Department of Computer Science, The University of Arizona, Tucson Arizona 85721.

M. G. Brown, J. T. Foote, G. J. F. Jones, K. Sparck Jones, and S. J. Young, "Automatic Content-Based Retrieval of Broadcast News," in Proc. ACM Multimedia 95, San Francisco, Nov. 1995.

J.T. Foote, "Content-Based Retrieval of Music and Audio," in C.-C.J. Kuo et al., editor, Multimedia Storage and Archiving Systems II, Proc of SPIE, vol. 3229, pp. 138-147, 1997.

J.T. Foote, "An Overview of Audio Information Retrieval," in ACM-Springer Multimedia Systems, vol. 7 No. 1, pp. 2-11, ACM Press/Springer-Vertag, Jan. 1999.

International Search Report & Written Opinion issued for PCT/US06/04593 dated Sep. 19, 2007.

* cited by examiner

DEVICE FOR MONITORING MULTIPLE BROADCAST SIGNALS

TECHNICAL FIELD

The system and method described herein relates to broadcast monitoring systems, and more particularly to broadcast monitoring devices employing modular tuners capable of monitoring disparate types or broadcasts.

BACKGROUND OF THE INVENTION

There are many instances where it is desirable to monitor broadcasts such as AM/FM radio, satellite radio, HD radio, internet, over-the-air (OTA) television, cable television, streaming video etc. on a relatively large scale. Broadcast monitoring and logging, advertising verification and content identification are just a few examples of current applications that require monitoring broadcasts. The currently available systems for broadcast monitoring are limited in the types of broadcasts they monitor and limited in their ability to be adjusted and reprogrammed. Many of the existing monitoring systems are based on PCI (Peripheral Component Interconnect) bus technology. Unfortunately, standard PCI is expensive to buy, complicated to operate, difficult to program, and increasingly vulnerable to timing issues as the scale of the application increases. In addition, the tuner modules used on current monitoring systems must be factory-installed onto the PCI boards resulting in a limited number of available configurations. Since the tuners in these devices are soldered onto the PC boards at the factory, they are not easily upgradeable or configurable in the field.

Therefore, what is needed is an improved system and method for monitoring broadcasts that is upgradeable, modular, easy to operate and relatively inexpensive.

BRIEF SUMMARY OF THE INVENTION

The present invention is directed to a system and method which a broadcast monitoring system for monitoring at least two broadcast signals is described. The monitoring system includes at least two tuner modules, each tuner module is adapted to receive a broadcast signal and produce an output corresponding to the broadcast signal, and a hub for receiving the outputs and aggregating and interfacing the outputs to a processing device. Each of the at least two tuner modules is detachable from the hub so that each of the at least two tuner modules can be replaced with a different tuner module adapted to receive a different broadcast in order to reconfigure the broadcast monitoring system.

Another embodiment of the present invention is directed toward a monitoring system and method. The system and method include receiving broadcast signals using one or more tuner modules and producing a USB output based upon the broadcast signal. The at least one tuner module is adapted to receive any type of signal including, but not limited to, AM/FM radio, satellite radio, internet radio, HD radio, OTA television, cable television, streaming video, satellite television, or any other type broadcast signal which could be received by an end user. Modular tuners are adapted to receive one or more types of broadcasts and to produce a combined output based upon outputs of the modular tuners. The modular tuners may be mounted on carrier board or may connect directly to output devices. A rack may be adapted to removably couple carrier boards and combine outputs from the carrier boards into a single output and provide the single output to a processing device or network interface. The processing device or network interface device can transfer control codes that alter operating parameters of the tuner modules. A processing device, such as a computer or controller, can include content identification software that is operable to process the broadcasts to extract characteristics or information that can be used to identify the content of the broadcast. The software may then identify the content of the broadcast using the characteristics or can send the extracted characteristics to a central processing location where the identification can take place. The processing device may also include storage for storing the broadcast data or the extracted characteristics or information.

Yet another embodiment of the present invention is directed toward a media monitoring system. The media monitoring system includes a tuner module having a tuner for receiving a broadcast signal and producing an output signal. An analog-to-digital converter in the tuner module converts the output signal into a digital output signal. A USB endpoint controller produces a USB output based upon the digital output signal. The system also includes a carrier board that is adapted to removably couple to at least two tuner modules. The carrier board has a USB hub for combining USB outputs from the tuner modules into a single USB output. A rack that is adapted to removably couple to at least two carrier boards combines the USB outputs from the carrier boards into a single USB output and provides the single USB output to a host computer. The rack includes an antenna and the carrier boards and the tuner modules include antenna connections that provide the tuners access to the antenna through the carrier boards and the tuner modules. The rack preferably includes at least four carrier boards having tuner modules for receiving AM/FM broadcasts, satellite radio broadcasts and TV audio broadcasts. The host computer includes content identification software for identifying selected media content received from the rack and storing the selected media content in a database. The host computer can transfer control codes to the tuner modules through the rack and the carrier boards.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
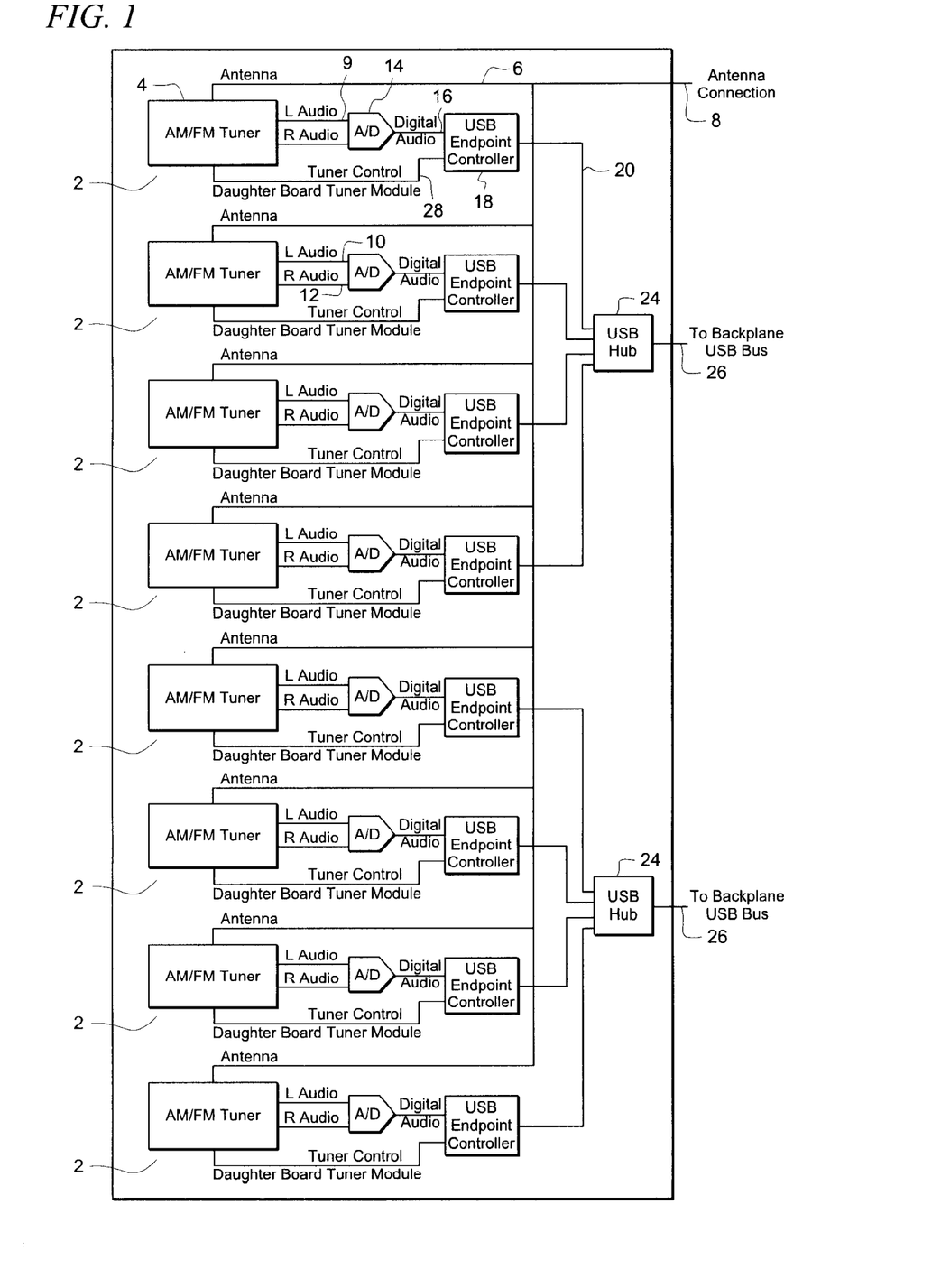
FIG. 1 is a block diagram of a broadcast monitoring system constructed in accordance with an embodiment of the present invention.

Referring now to FIG. 1, a block diagram of an embodiment of a broadcast monitoring system for monitoring AM/FM radio broadcasts constructed in accordance with the concepts described herein is shown. The system includes a series of tuner modules 2 that are used to receive AM/FM radio broadcasts. Each tuner module 2 has an AM/FM tuner 4 that receives broadcast signals through an antenna 6. The modules may each have individual antennas 6 or share a common antenna connection 8. The modules 2 produce output signals 9, such as left stereo output 10 and right stereo output 12 audio outputs, which are sent to an associated analog-to-digital converter 14 which produces a digital output signal 16 based upon the received input signals 10 and 12. The digital signal 16 is then sent to an endpoint controller 18, which can be a USB endpoint controller, which produces a corresponding signal 20 in a desired format, in this example a USB format. The USB formatted signals 20 from the various tuner modules 2 are then collected by an associated hub 24 and sent to a backbone bus 26. The hub is preferably attached in a removable manner such as through a socket that allows it to be removed without the use of any tools. The bus 26 functions to transfer the signals to a host computer as discussed in more detail below. Tuner control inputs 28 allow the host computer to modify the operating parameters of the tuner modules 2.

The tuner modules 2 are substantially self contained modules that can be easily removed and replaced with other modules. While the modules 2 shown in FIG. 1 are all AM/FM tuner modules, the modules are not limited to AM/FM broadcasts and can be adapted to receive any type of broadcast signal such as satellite radio, HD radio, digital television, satellite television, broadcast television, streaming audio or video, etc. The ability to remove and replace the modules 2 without substantially altering the system's configuration allows the system to be easily customized to a particular customer's needs and is a substantial benefit over prior art monitoring systems.

Figure 2A:
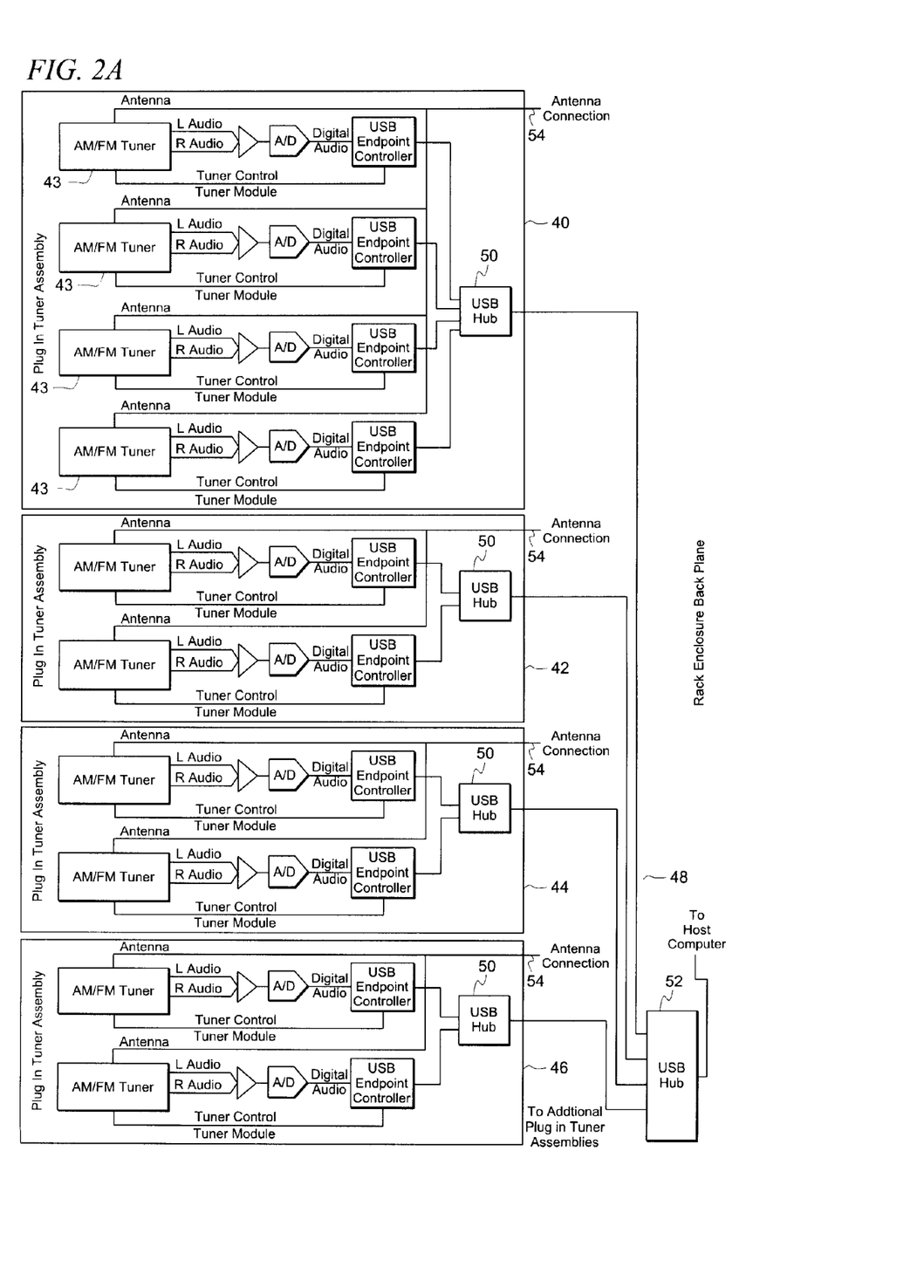
FIG. 2(a) is a block diagram of a broadcast monitoring system having a series of different tuner modules on carrier boards connected to a host computer through a USB hub in a rack enclosure constructed in accordance with an embodiment of the present invention.

Referring now to FIG. 2(a), a system diagram of an embodiment of a broadcast media monitoring system constructed in accordance with concepts described herein is shown. The system has a number of carrier boards 40, 42, 44 and 46 that are plugged into the back plane 48 of a rack enclosure. Alternatively, the carrier boards 40, 42, 44 and 46 can be removably mounted on a main assembly or computer board through sockets or similar mounting structures. The carrier boards 40, 42, 44 and 46 each include one or more tuner modules 43 that are plugged into the carrier board. In FIG. 2, the carrier boards 40, 42, 44 and 46 include four AM/FM tuner modules on carrier board 40, two XM satellite radio tuner modules on carrier board 42, two TV audio tuner modules on carrier board 44 and two HD radio tuner modules on carrier board 46. However, the tuner modules 43 used are preferably user selectable and, thus, the particular type used will of course depend upon the application for which the system is being configured. Each carrier board 40, 42, 44 and 46 has an internal hub, such as USB hub 50, for combining the output from each tuner 43 into a single data stream. The rack enclosure's back plane 48 has an additional USB hub 52 for combining the output of the carrier board USB hubs 50 into a single output for sending to a host computer. In addition, the rack preferably has antenna connections 54 for each of the tuner modules 43. The rack also preferably provides power to the individual modules and boards in a conventional manner.

As discussed above, the use of a rack configuration with removable carrier boards 40, 42, 44 and 46 and tuner modules 43 allows the system to be easily configured and reconfigured to satisfy the particular needs of a monitoring customer. The use of USB hubs allows a monitoring system constructed in accordance with an embodiment of the present invention to be more easily scaled to monitor more broadcasts than currently available systems. In addition, embodiments that use USB allow for a more modular solution that is directed toward specific broadcasts, resulting in more flexible configurations, and lower maintenance and upgrade costs. Upgrades to the system can be accomplished by simply unplugging the old tuner modules on the carrier boards and plugging in new ones. Carrier cards can be reconfigured as desired with any combination of tuner modules. Due to the plug-and-play, hot-swappable, nature of USB, replacing a single tuner module may be accomplished without even taking the system offline. Therefore, maintenance may be performed, and upgrades installed, with no interruption of mission-critical functions. However, while USB is preferred, any suitable type of communication protocol may be used.

Figure 2B:
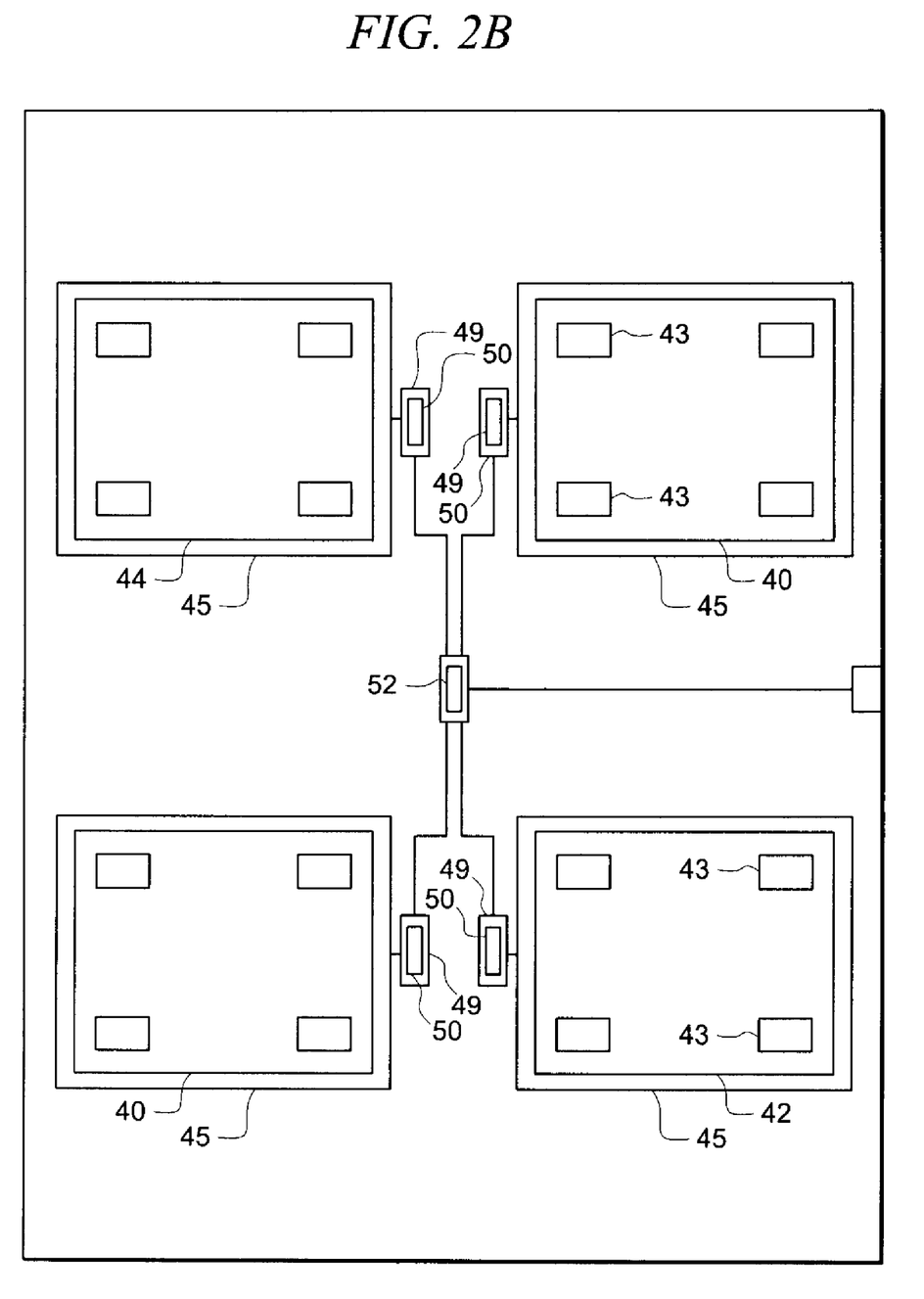
FIG. 2(b) is a block diagram of a broadcast monitoring system having a series of different tuner modules on carrier boards connected to a host computer through a USB hub on a main mounting board constructed in accordance with an embodiment of the present invention.

An alternative embodiment of the invention is shown in FIG. 2(b). The rack enclosure back plane 48 has been replaced by a main mounting board 47 that has the carrier boards 40, 42, 44 and 46 removably mounted thereon with sockets 45. The carrier board hubs 50 are also removably mounted in sockets 49 on the main board 47. Positioning the hubs 50 on the main board 47 decreases the cost of the carrier boards 40, 42, 44 and 46. Making the hubs 50 and 52 removable in the field without tools by mounting them in sockets, and the hot-swappable nature of USB, allows for easy reconfiguration of a system of main boards, carriers and tuners without the need to return them to the manufacturer or continuously reboot the system.

Figure 3:
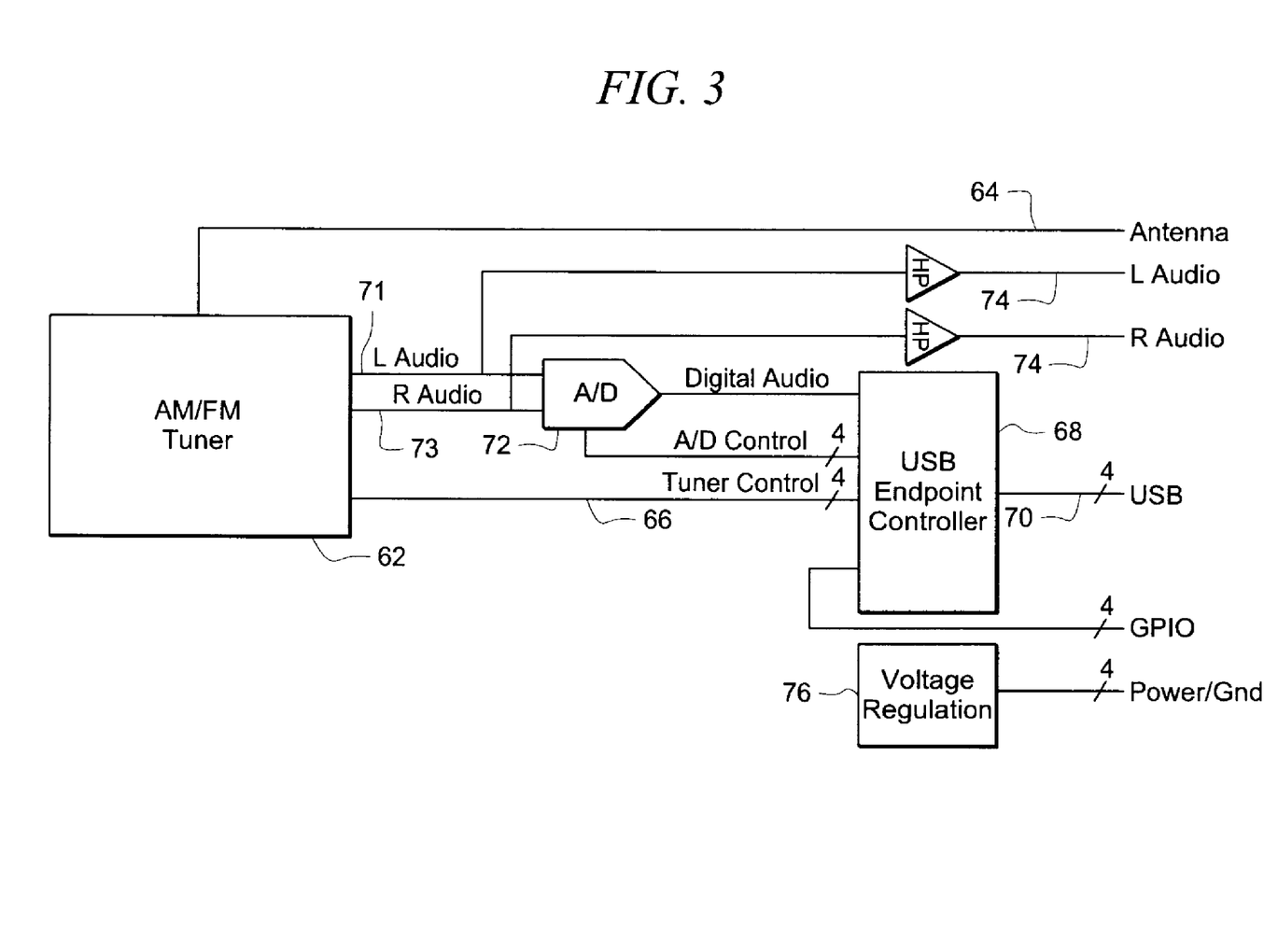
FIG. 3 is a block diagram of an AM/FM tuner module constructed in accordance with an embodiment of the present invention.

Referring now to FIG. 3 a block diagram of an embodiment of an individual tuner module constructed in accordance with the concepts described herein is shown. In the example of FIG. 3, the tuner module is shown as an AM/FM tuner module, though as described extensively herein, any the module may be constructed using any type of tuner. Module 60 includes an AM/FM tuner 62 that receives and demodulates a radio frequency signal detected with an antenna 64. The tuner 62 is preferably provided with a tuner control input 66 that allows a user to adjust the reception parameters, including but not limited to the tuning frequency, of the tuner 62 through a processing device such as a host computer. The tuner control input 66 is received from a USB endpoint controller 68 that sends information to, and receives information from, the host computer through a connection 70. The host computer may receive the configuration information over a network from a centralized control center that is able to control multiple remote locations each containing broadcast monitoring systems such as those described herein. The tuner 62 provides a left 71 and a right 73 audio output that are provided to an analog-to-digital converter 72 and external connection 74. The external connection 74 can be used to allow a user to directly listen to the received signal or to troubleshoot the device in the event of any potential problems. The USB endpoint controller 68 receives the output from the analog-to-digital converter 72 and couples the digital data to its USB output 70. A voltage regulation circuit 76 may be provided to condition the power provided to the tuner module 60 by the rack on which it is installed.

Figure 4:
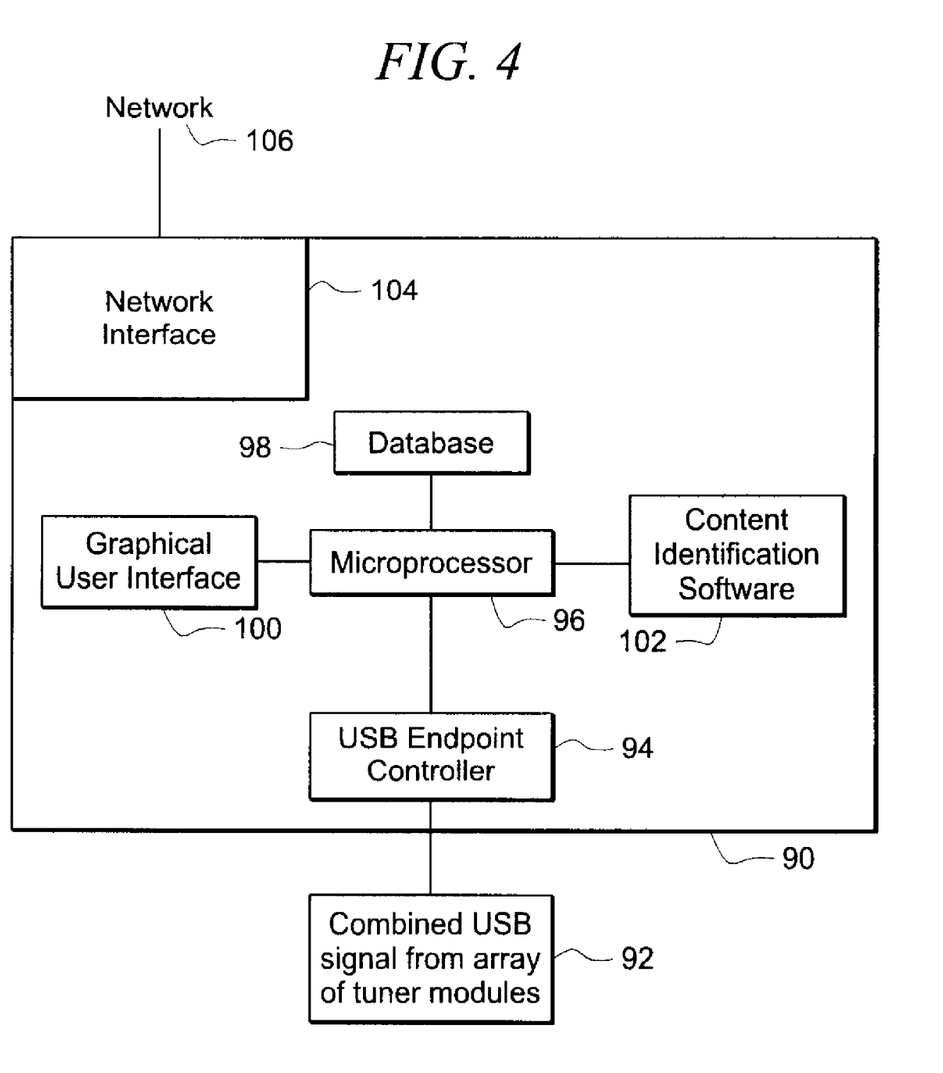
FIG. 4 is block diagram of a host computer for use with a broadcast monitoring system constructed in accordance with an embodiment of the present invention.

Referring now to FIG. 4, a functional block diagram for an embodiment of a host computer 90 that can be used with or in the broadcast monitoring systems according to the concepts described herein is shown. The host computer 90 receives information 92 from the tuner modules and mounting rack discussed above with an USB endpoint controller 94. A microprocessor 96 then receives the information from the USB endpoint controller 94 and saves it in a database 98. A user can access the stored media files through a graphical user interface 100. The graphical user interface 100 also allows a user to send control codes to the tuner modules to alter their operating parameters and configure their tuners. The microprocessor 96 may use content identification software 102 to automatically identify certain types of media content. The identified types may then be automatically stored in a file in the database 98 for later review by a user. The precise configuration of the host computer 90 will of course depend upon the particular broadcast monitoring application of the customer. Host computer 90 also includes a network interface 104 which allows host computer 90 to communicate with other devices over network 106. Host computer 90 may send broadcast data or data derived from the broadcast signals to a remote device for storage, analysis and/or identification. Host computer 90 may receive configuration data, updates, upgrade or other data from one or more remote devices which are connected to network 106. Network interface 104 may be a wire line or wireless interface.

Figure 5A:
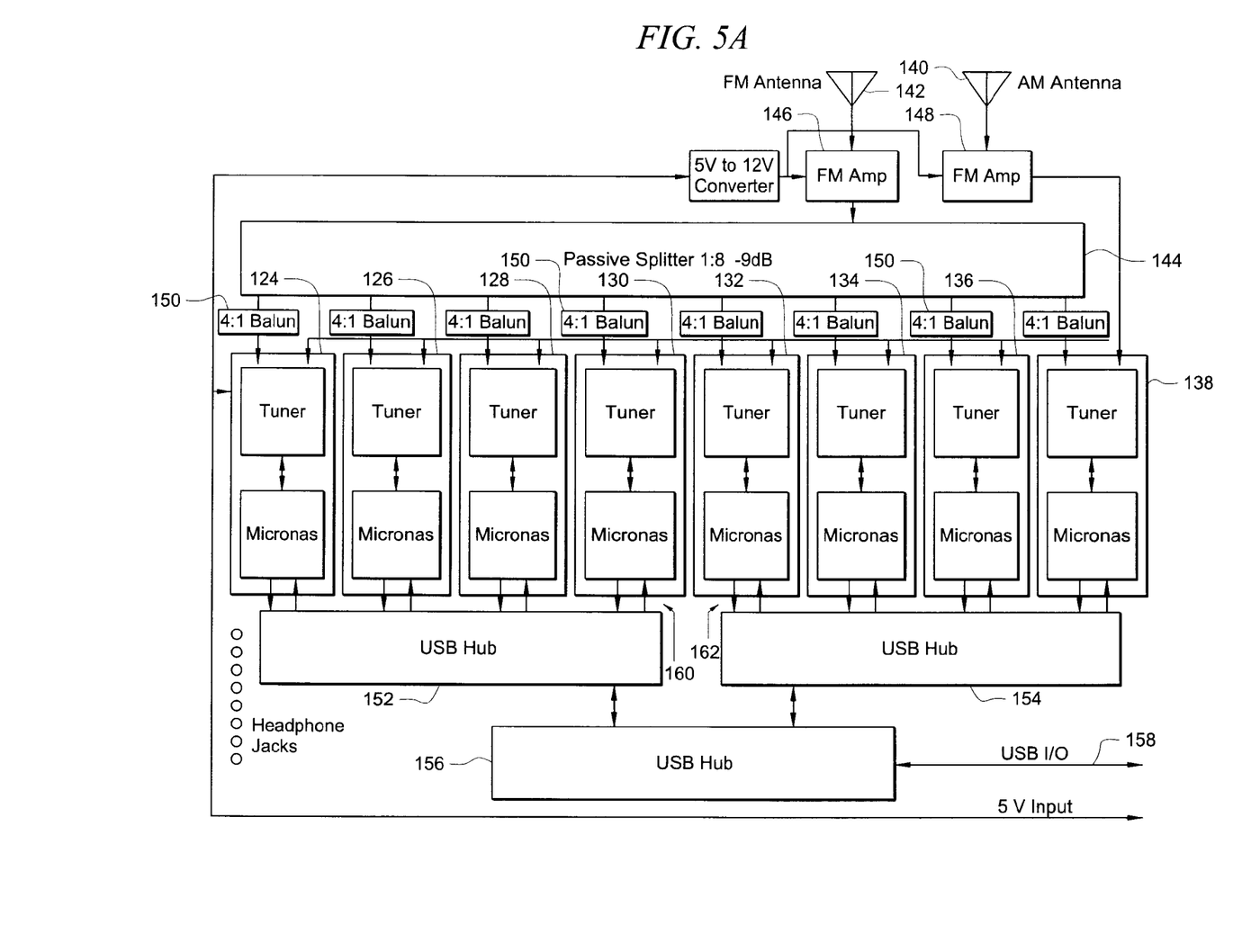
FIGS. 5(a) and (b) are block diagrams of an eight channel broadcast monitoring system constructed in accordance with an embodiment of the present invention that utilizes a single board computer.
Figure 5B:
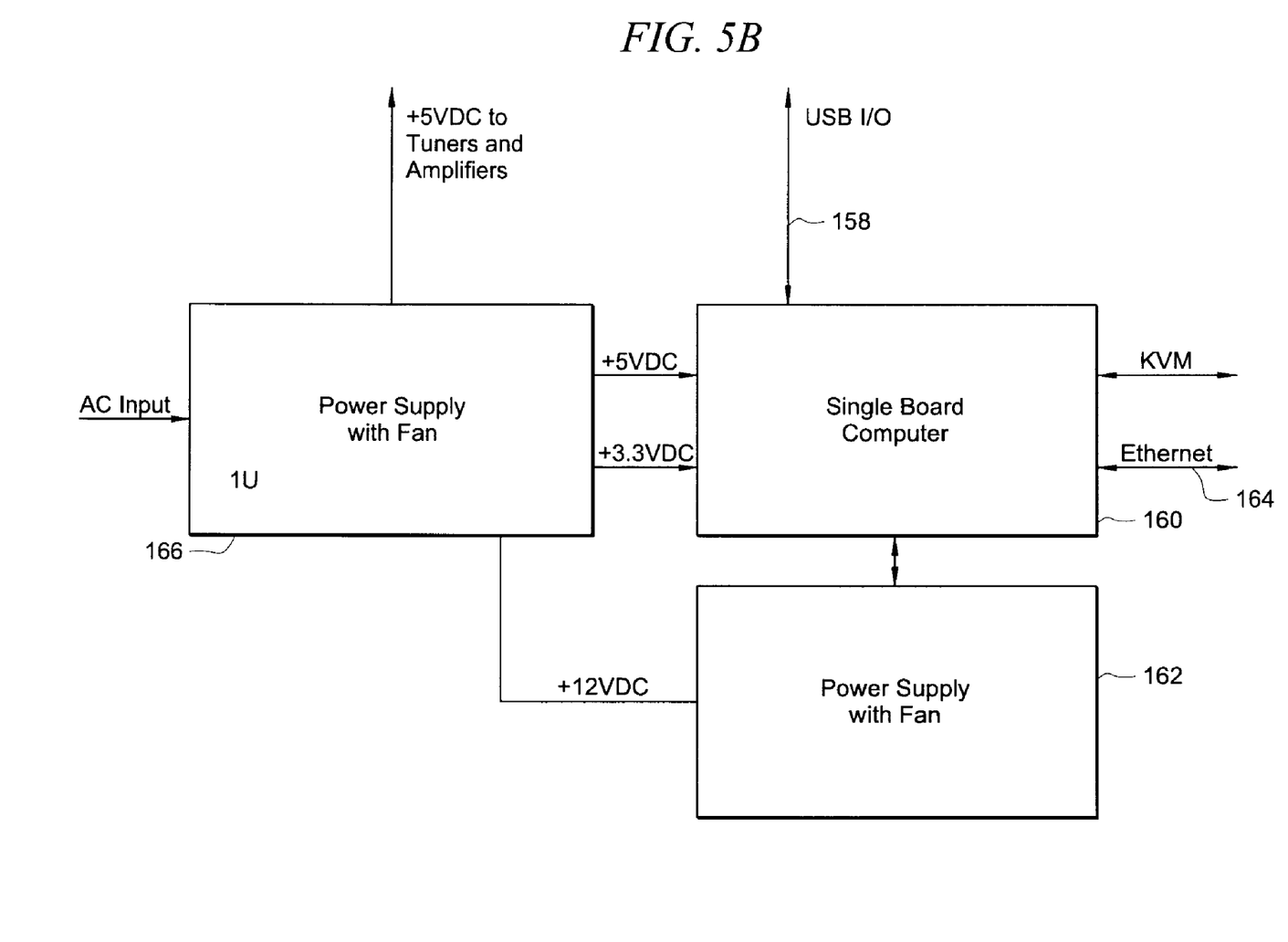

Referring now to FIGS. 5(*a*) and (*b*), a block diagram of an embodiment of an AM/FM broadcast monitoring system constructed utilizing a single board computer in accordance with the concepts described herein is shown. FIG. 5(*a*) illustrates a receiver carrier card 120 and FIG. 5(*b*) illustrates a single board computer 122 that manages the output from the receiver carrier card 120. The receiver carrier card 120 includes eight tuners 124, 126, 128, 130, 132, 134, 136 and 138 that are grouped into two clusters of four tuners each. Cluster 160 is comprised of tuners 124, 126, 128 and 130 while cluster 162 is comprised of tuners 132, 134, 136 and 138. Each cluster 160, 162 is associated with a USB hub, here 152 and 154, respectively and each cluster is preferably made of the same type of tuner so that a cluster can share a connection to an antenna. In FIG. 5(*a*) each cluster is coupled to an AM antenna 140 and an FM antenna 142 through associated amplifiers 146 and 148, passive splitter 144 and couplers 150, though one of the cluster could be connected to a OTA television antenna, a satellite radio or TV antenna, an internet connection or any other type of connection/antenna required to receive the desired broadcast signal. Two USB hubs 152 and 154 are used to multiplex the outputs of the tuners 124-138 and provide their output to a third USB hub 156 which multiplexes their outputs into a single USB input/output 158.

The USB input/output 158 is preferably provided to a single board computer 160 that monitors the eight broadcast channels and stores selected information in a hard drive 162. Communication between the remote host computer and the tuners is controlled by the single board computer. The single board computer 160 routes control signals for the turners 124-138 from the host computer and routes received signals from the tuners 124-138 to the host computer. Many operating systems currently in use, such as Windows™ and Linux™, only allow for simultaneous monitoring of eight audio channels. To monitor additional channels in embodiments using these operating systems, additional single board computers 160 can be joined together such that each single board computer 160 monitors eight channels and uses the channel restricted operating system. For example, two single board computers 160 could be combined to with sixteen tuners to monitor sixteen broadcast channels or eight single board computers 160 could be used to monitor sixty-four tuners and broadcast channels. In this manner, the system can be scaled to simultaneously monitor any desired number of channels. The single board computer 160 preferably has an Ethernet connection 164, preferably via TCP-IP, to a network such that the results of the broadcast monitoring can be reviewed and accessed through the network at the host computer. A cooled power supply 166 is preferably used to convert an AC input into the DC voltage power supplies required by the components of the broadcast monitoring system. While FIG. 5(*a*) shows AM/FM tuner modules and antenna, any types of tuner modules and antennas, cable connections, network connections or other input devices may be used according to the concepts described herein.

Figure 6:
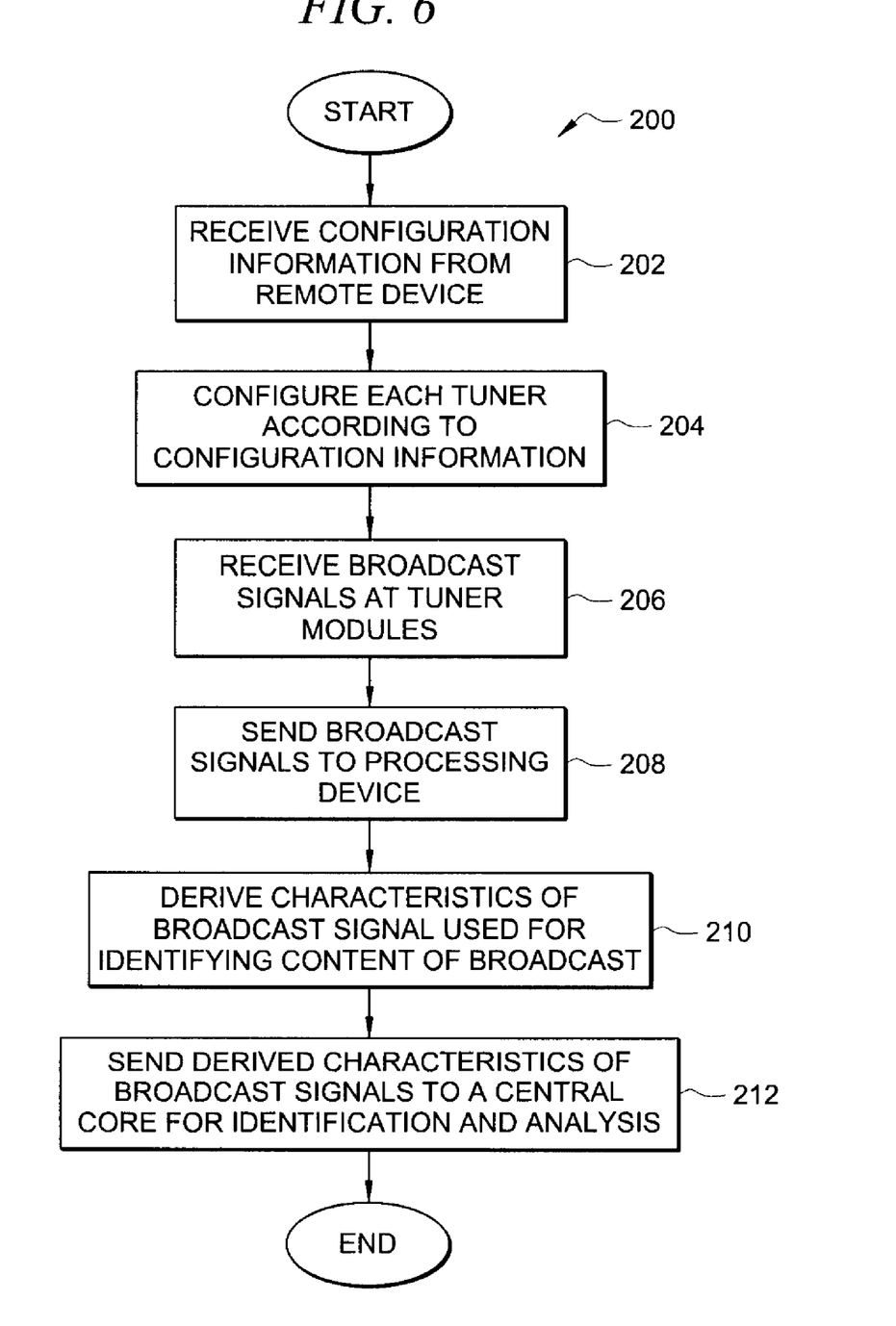
FIG. 6 is a flow chart illustrating an embodiment of a method of monitoring multiple broadcast signals in accordance with the present invention.

Referring now to FIG. 6 a flow chart showing an embodiment of a method of operation for a broadcast monitoring system according to the concepts described herein is shown. Reference will be made to the elements of the monitoring system described with reference to FIGS. 1-5. Method 200 begins with the monitoring system receiving configuration information from a device remote to the monitoring system. This configuration information is received over the network interface as shown by process 202 and sent to the processing device where it is used by the processing device to place each of the tuner modules into the desired configuration and tuned to the desired broadcast as shown by process 204. After the tuner modules are configured and tuned to their intended broadcasts, process 206 shows the tuner modules receiving broadcast information. Process 208 reflects each tuner module sending the broadcast information to the processing device. The broadcast information may be aggregated by hubs between the tuner modules and processing device and may be converted from an analogue signal to a digital signal for processing.

Once at the processing device, the broadcast signal(s) can be processed by the processing device using a program to derive characteristics or information from the broadcast signal, shown by process 210 which can be used to identify the content of the broadcast signal. Examples of such characteristics or information and how they are used to identify the content of a broadcast are described in U.S. Pat. No. 6,990,453, issued Jan. 24, 2006, the contents of which are incorporated herein by reference. These derived characteristics can then be sent to a central core where they are used to perform the identification as shown in process 212.

As an alternative to sending the derived characteristics to a central core remote from the monitoring system, the monitoring system may include sufficient processing power and storage media to perform all or a subset of the content identification locally. A local database may contain an index of the most frequent content which would allow a large portion of the broadcast content to be identified locally. Any content unable to be identified locally can be sent in the form of the derived characteristics to a remote core for more processing against a larger index of known content. The information concerning identified content can also be sent to a remote processing center for analysis and reporting.

The above discussed embodiments represent a substantial improvement upon the prior art for a number of reasons. First, the modular nature of the system makes it easily configurable to a user's specific requirements by simply selecting various combinations of tuner modules to include in the rack and carrier boards. Second, the use of the USB protocol allows for a less convoluted design that is more easily expandable and serviceable. Third, the use of USB makes the system more easily reprogrammable than the currently used peripheral component interconnect bus based systems. Therefore, the present invention represents a substantial improvement upon the prior art.

Thus, although there have been described particular embodiments of the present invention of a new and useful DEVICE FOR MONITORING BROADCAST SIGNALS, it is not intended that such references be construed as limitations upon the scope of this invention except as set forth in the following claims.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A broadcast monitoring system for monitoring at least two broadcast signals, the monitoring system comprising:
    at least two tuner modules wherein each tuner module is adapted to receive a broadcast signal and produce an output corresponding to the broadcast signal;
    a hub for receiving the outputs and aggregating and interfacing the outputs to a processing device, wherein the processing device is adapted to transfer control codes to the at least two tuner modules for altering an operating parameter thereof, and wherein each of the at least two tuner modules is detachable from the hub so that each of the at least two tuner modules can be replaced with a different tuner module adapted to receive a different broadcast in order to reconfigure the broadcast monitoring system.

2. The system of claim 1 wherein the output of each tuner module is a USB output and the hub is a USB hub.

3. The system of claim 1 wherein the hub is removably mounted on the broadcast monitoring system so that the hub can be removed and replaced with another hub by a user.

4. The system of claim 1 wherein the processing device further comprises content identification software for deriving characteristics of broadcasts received by the tuners.

5. The system of claim 1 wherein the modular tuners are each chosen from a group of modular tuners comprising over-the-air (OTA) radio tuners, OTA television tuners, cable radio tuners, cable television tuners, satellite radio tuners, satellite television turners, or network interface cards for connecting to the Internet and receiving streaming audio or video.

6. A media monitoring system comprising:
    at least two turner modules for receiving broadcast signals and producing an output based upon the broadcast signals;
    at least one carrier board adapted to removably couple to the at least tuner modules and produce a combined output based upon outputs of the at least two tuner modules; and
    a rack adapted to removably couple to the at least two carrier boards and combine output from the at least two carrier boards into a single output and provide the single output to a host computer, wherein the host computer is configured to identify and store selected broadcasts received from the tuner modules.

7. The system of claim 6 wherein one of the at least two turner modules is adapted to receive an AM/FM broadcast signal.

8. The system of claim 6 wherein one of the at least two tuner modules is adapted to receive a satellite radio broadcast signal.

9. The system of claim 6 wherein one of the at least two tuner modules is adapted to receive a digital radio broadcast signal.

10. The system of 6 wherein the host computer can transfer control codes that alter an operating parameter of the tuner modules through the rack and the carrier boards to the tuner modules.

11. The system of claim 6 further comprising a removable hub for combining the outputs of the carrier boards.

12. A method for monitoring multiple broadcast signals comprising:
    sending configuration information to a processing device attached to a plurality of modular tuners;
    configuring one of more of the plurality of modular tuners, the configuration including setting the tuner to receive a specified broadcasts;
    receiving multiple broadcasts with the plurality of modular tuners; and
    sending the broadcast signals to the processing device, the processing device being operable to derive characteristics from the broadcast signals that are useful in identifying content of a portion of the broadcast signals, and the processing device being operable to compare the characteristics against an index of known content to determine the content of the portion of the broadcast signal.

13. The method of claim 12 wherein the processing device is further operable to send the characteristics to a central core for identification.

14. The system of claim 12 wherein the processing device is further operable to send information concerning the identified content and the characteristics of any unidentified content to a central core.

15. The system of claim 12 wherein the tuners are connected to the processing system over a USB bus and using USB hubs, the USB hubs aggregating the broadcast signals form a cluster of modular tuners from the plurality of modular tuners wherein the USB hubs are removably in sockets.

* * * * *